(12) United States Patent
Takahashi

(10) Patent No.: US 7,883,635 B2
(45) Date of Patent: Feb. 8, 2011

(54) SUBSTRATE TREATING APPARATUS AND METHOD

(75) Inventor: Hiroaki Takahashi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 41 days.

(21) Appl. No.: 12/401,697

(22) Filed: Mar. 11, 2009

(65) Prior Publication Data

US 2009/0179008 A1 Jul. 16, 2009

Related U.S. Application Data

(62) Division of application No. 11/360,946, filed on Feb. 23, 2006, now abandoned.

(30) Foreign Application Priority Data

Feb. 24, 2005 (JP) ............................. 2005-049044
Feb. 24, 2005 (JP) ............................. 2005-049045

(51) Int. Cl.
*C03C 15/00* (2006.01)
(52) U.S. Cl. ........................ 216/84; 216/83; 216/103; 438/745
(58) Field of Classification Search .................. 216/83, 216/84, 86, 103; 438/745, 754
See application file for complete search history.

(56) References Cited

U.S. PATENT DOCUMENTS 5,275,184 A * 1/1994 Nishizawa et al. ........ 134/57 R
5,938,885 A * 8/1999 Huang et al. ........... 156/345.15
2004/0140365 A1   7/2004 Izuta
2004/0200806 A1  10/2004 Izuta et al.
2004/0251017 A1 * 12/2004 Pillion et al. ................. 165/289

FOREIGN PATENT DOCUMENTS

JP         11-219931      8/1999
JP         2004-221540    8/2004
JP         2004-356409    12/2004

* cited by examiner

*Primary Examiner*—Lan Vinh
(74) *Attorney, Agent, or Firm*—Ostrolenk Faber LLP

(57) ABSTRACT

A substrate treating apparatus for treating substrates with a treating solution having a mixture of a chemical and a diluent. The apparatus includes a treating tank for storing the treating solution, a heating device for heating the treating solution, a supply pipe for supplying a gas at a fixed flow rate, the supply pipe having a detecting end at a predetermined depth in the treating tank, a pressure detecting device for detecting a pressure in the supply pipe, a converting device for converting the pressure detected by the pressure detecting device into a voltage, a storage device for storing, as a reference voltage, a voltage received from the converting device when a reference liquid at a reference temperature is stored in the treating tank, and a computing device for deriving an actual specific gravity of the treating solution from the reference voltage stored in the storage device, and a treatment voltage received from the converting device when the treating solution stored in the treating tank has been heated to a treating temperature by the heating device.

5 Claims, 8 Drawing Sheets measurement of ref. voltage measurement of treatment voltage

Fig.9

| temp. [°C] | treatment voltage [V] ($V_{SOL}$) | ref. voltage [V] ($V_{DIW}$) | actual specific gravity [g/cm³] ($V_{SOL}/V_{DIW}$=m1) | measured specific gravity [g/cm³] (m2) | ratio (m1/m2=k) |
|---|---|---|---|---|---|
| 160 | 1.334 | 0.845 | 1.579 | 1.712 | 1.084 |
| 155 | 1.321 | | 1.563 | 1.694 | 1.084 |
| 150 | 1.304 | | 1.543 | 1.674 | 1.084 |

SUBSTRATE TREATING APPARATUS AND METHOD

CROSS-REFERENCE TO RELATED APPLICATIONS

The present application is a Divisional Application of U.S. Ser. No. 11/360,946 filed Feb. 23, 2006, which application claims the benefit and priority of JP2005-049044 filed Feb. 24, 2005 and JP2005-049045 filed Feb. 24, 2005, all incorporated by reference.

BACKGROUND OF THE INVENTION

1. Field of the Invention

This invention relates to substrate treating apparatus and methods for treating, with a treating solution, substrates such as semiconductor wafers, glass substrates for liquid crystal displays and glass substrates for photomasks (hereinafter simply called "substrates").

2. Description of the Related Art

A conventional apparatus of the type noted above has a nitrogen gas source, a regulator, a supply pipe and a pressure detector (Japanese Unexamined Patent Publication No. 11-219931 (1999), (paragraphs "0040" to "0050" and FIG. 2), for example). This apparatus supplies nitrogen gas at a constant flow rate from the nitrogen gas source into a treating tank, with a detection end of the supply pipe disposed at a predetermined depth in the tank. The pressure detector detects a pressure of the nitrogen gas supplied into the treating tank. The pressure detected in this way is a pressure at the predetermined depth in the treating tank, and has a correlation with the specific gravity of a treating solution. The concentration of the treating solution is controlled based on the detected specific gravity, for example.

Specifically, the apparatus further includes a voltage converter for converting the pressure detected by the pressure detector into voltage. This voltage is applied to a controller for displaying its value and controlling the pressure.

The above conventional example has the following drawbacks.

With the conventional apparatus, the pressure detected is variable even with slight variations in the position of the detection end of the supply pipe. Thus, the pressure varies each time the height of the supply pipe is adjusted. The pressure is variable also among different apparatus of the same construction. The detected pressure serves only as a reference peculiar to the apparatus concerned. This pressure cannot be used for comparison with other apparatus of the same construction. In addition, the detected pressure, i.e. the meaning of voltage, is unintelligible to the user. Further, when adjusting treating conditions of the apparatus, the adjustment must be carried out in a way suited for each individual apparatus, resulting in increased man-hours.

SUMMARY OF THE INVENTION

This invention has been made having regard to the state of the art noted above, and its object is to provide a substrate treating apparatus and method for obtaining an actual specific gravity of a treating solution as an absolute value by setting a reference, and for reducing man-hours for adjustment work.

Another object of the invention is to provide a substrate treating apparatus and method for obtaining a reduced concentration as an absolute value by setting a reference, and for reducing man-hours for adjustment work.

The above objects are fulfilled, according to this invention, by a substrate treating apparatus for treating substrates with a treating solution having a mixture of a chemical and a diluent, comprising a treating tank for storing the treating solution; a heating device for heating the treating solution; a supply pipe for supplying a gas at a fixed flow rate, the supply pipe having a detecting end at a predetermined depth in the treating tank; a pressure detecting device for detecting a pressure in the supply pipe; a converting device for converting the pressure detected by the pressure detecting device into a voltage; a storage device for storing, as a reference voltage, a voltage received from the converting device when a reference liquid at a reference temperature is stored in the treating tank; and a computing device for deriving an actual specific gravity of the treating solution from the reference voltage stored in the storage device, and a treatment voltage received from the converting device when the treating solution stored in the treating tank has been heated to a treating temperature by the heating device.

The reference liquid at the reference temperature is stored in the treating tank in advance of treatment. In this state, the converting device converts the pressure received from the pressure detecting device into a voltage, which is stored in the storage device as a reference voltage. Next, the treating solution stored in the treating tank is heated to the treating temperature by the heating device. The pressure detected in the state is converted into a treatment voltage. The computing device derives an actual specific gravity of the treating solution from the treatment voltage and the reference voltage stored beforehand. Then, for example, the treating solution is adjusted based on this actual specific gravity. The actual specific gravity expresses a ratio to the reference voltage of this apparatus, and has an absolute meaning. A reference voltage detected from among different apparatus can be used for comparison between the apparatus, and can represent an absolute value readily understood by the user. Such a reference common to different apparatus enables a reduction in man-hours for adjusting the respective apparatus.

The reference liquid noted above is deionized water or distilled water, for example. The above reference temperature is 25° C. or 25 to 30° C., for example. The treating solution may have phosphoric acid diluted with deionized water, or hydrofluoric acid diluted with deionized water, for example.

Preferably, the apparatus further comprises a circulating system for supplying the reference liquid and the treating solution drained from the treating tank back to the treating tank, the reference liquid and the treating solution being circulated at the same flow rate through the circulating system when detecting the reference voltage and the treatment voltage.

Because of the construction of the treating tank, the reference liquid simply filling the tank may have its surface level lowering with time. It is therefore desirable to circulate the reference liquid and treating solution through the circulating system. In this way, the surface level may be maintained constant to maintain the detecting end of the supply pipe at a constant depth. Thus, the same condition is provided for detecting the pressures of the reference liquid and treating solution. By equalizing the conditions for detecting the two pressures, the actual specific gravity is measured with increased accuracy.

In another aspect of the invention, a substrate treating method is provided for treating substrates with a treating solution having a mixture of a chemical and a diluent. The method comprises a step of storing, as a reference voltage, a voltage obtained by a converting device according to a pressure at a predetermined depth in a treating tank when a reference liquid at a reference temperature is stored in the treating tank in advance of treatment; a step of deriving an actual specific gravity of the treating solution from the reference voltage and a treatment voltage received from the converting device when the treating solution stored in the treating tank has been set to a treating temperature; and a step of adjusting the treating solution based on the actual specific gravity.

The reference liquid at the reference temperature is stored in the treating tank in advance of treatment. The voltage obtained by the converting device in this state is stored as a reference voltage. Next, the treating solution stored in the treating tank is heated to the treating temperature by the heating device. The voltage obtained by the converting device in the state is regarded as a treatment voltage. An actual specific gravity of the treating solution is derived from the treatment voltage and the reference voltage stored beforehand. The treating solution is adjusted based on this actual specific gravity. The actual specific gravity expresses a ratio to the reference voltage of this apparatus, and has an absolute meaning. The actual specific gravity can be used for comparison between different apparatus, and can represent an absolute value readily understood by the user. A reference common to different apparatus enables a reduction in man-hours for adjusting the respective apparatus.

In a further aspect of the invention, a substrate treating apparatus for treating substrates with a treating solution having a mixture of a chemical and a diluent, which apparatus comprises a treating tank for storing the treating solution; a heating device for heating the treating solution; a supply pipe for supplying a gas at a fixed flow rate, the supply pipe having a detecting end at a predetermined depth in the treating tank; a pressure detecting device for detecting a pressure in the supply pipe, and outputting a voltage corresponding to the pressure; a storage device for storing, as a reference voltage, a voltage received from the pressure detecting device when a reference liquid at a reference temperature is stored in the treating tank; an actual specific gravity calculating device for deriving an actual specific gravity of the treating solution from the reference voltage stored in the storage device, and a treatment voltage received from the pressure detecting device when the treating solution stored in the treating tank has been heated to a treating temperature by the heating device; a reducing device for determining a reduced actual specific gravity by reducing the actual specific gravity to a specific gravity in time of a measuring temperature when measuring a specific gravity-concentration characteristics of the treating solution; and a computing device for deriving a reduced concentration of the treating solution from the reduced actual specific gravity and the specific gravity-concentration characteristics.

The reference liquid at the reference temperature is stored in the treating tank in advance of treatment. The voltage outputted from the pressure detecting device in this state is stored as a reference voltage in the storage device as a reference voltage. Next, the treating solution stored in the treating tank is heated by the heating device. The voltage obtained in the state is regarded as a treatment voltage. The actual specific gravity calculating device derives an actual specific gravity of the treating solution from the treatment voltage and the reference voltage. The actual specific gravity expresses a ratio to the reference voltage of this apparatus, and has an absolute meaning. A reference voltage measured of different apparatus can be used for comparison between different apparatus. The reducing device reduces the actual specific gravity to a specific gravity at the measurement temperature to determine a reduced actual specific gravity. The reduced actual specific gravity is a reduced value of the actual specific gravity obtained from the temperature of the treating solution in time of measuring the specific gravity-concentration characteristics. The computing device determines a reduced concentration, assuming that the treating solution has cooled to the measurement temperature, based on the reduced actual specific gravity and specific gravity-concentration characteristics. Thus, the actual specific gravity expresses a ratio to the reference voltage of the apparatus. The reduced concentration obtained by temperature reduction based on the actual specific gravity also has an absolute value. A reduced concentration determined for different apparatus can be used for comparison between the apparatus, and can be an absolute entity readily understood by the user. Such a reference common to different apparatus enables a reduction in man-hours for adjusting the respective apparatus.

Generally, data of the specific gravity-concentration characteristics of the treating solution is collected only at a certain measurement temperature. Data of the treating solution at the treating temperature does not necessarily exist. It is therefore necessary to reduce the actual specific gravity of the treating solution at the treating temperature to a specific gravity at the measurement temperature.

The reference liquid noted above is deionized water or distilled water, for example. The above reference temperature is 25° C. or 25 to 30° C., for example. The treating solution may have phosphoric acid diluted with deionized water, or hydrofluoric acid diluted with deionized water, for example.

Preferably, the reducing device is arranged to determine the reduced actual specific gravity at the treating temperature by multiplying the actual specific gravity obtained by the actual specific gravity calculating device, by a factor set beforehand according to a ratio between the actual specific gravity of the treating solution at the treating temperature and a measured specific gravity obtained by a specific gravity meter from the treating solution at a measurement temperature.

It has been found through various experiments conducted by Inventor that a substantially fixed ratio exists between the actual specific gravity obtained by measuring the specific gravity of the treating solution at the treating temperature, and a measured specific gravity obtained by a specific gravity meter from the treating solution placed in a sealed container and cooled to the measurement temperature. Thus, a reduced actual specific gravity may be obtained by multiplying the actual specific gravity by a factor set beforehand.

In a still further aspect of the invention, a substrate treating method for treating substrates with a treating solution having a mixture of a chemical and a diluent. This method comprises a step of deriving an actual specific gravity of the treating solution from a reference voltage obtained by a pressure detecting device according to a pressure at a predetermined depth in a treating tank when a reference liquid at a reference temperature is stored in the treating tank in advance of treatment, and a treatment voltage obtained by the pressure detecting device when the treating solution stored in the treating tank has been set to a treating temperature; a step of determining a reduced actual specific gravity by reducing the actual specific gravity to a specific gravity in time of a measuring temperature when measuring a specific gravity-concentration characteristics of the treating solution; a step of deriving a reduced concentration of the treating solution from the reduced actual specific gravity and the specific gravity-concentration characteristics; and a step of adjusting the treating solution based on the reduced concentration.

An actual specific gravity of the treating solution derived from the reference voltage obtained by the pressure detecting device when the reference liquid at the reference temperature is stored in the treating tank in advance of treatment, and the treatment voltage outputted from the pressure detecting device when the treating solution has been heated to the treating temperature. The actual specific gravity expresses a ratio to the reference voltage of this apparatus, and has an absolute meaning. A reference voltage measured of different apparatus can be used for comparison between different apparatus. The actual specific gravity is reduced to a specific gravity at the measurement temperature to determine a reduced actual specific gravity. A reduced concentration is determined, assuming that the treating solution has cooled to the measurement temperature, based on the reduced actual specific gravity and specific gravity-concentration characteristics. The treating solution is adjusted based on the reduced concentration. Thus, the actual specific gravity expresses a ratio to the reference voltage of the apparatus. The reduced concentration obtained by temperature reduction based on the actual specific gravity also has an absolute value. As a result, a reduced concentration determined for different apparatus can be used for comparison between the apparatus, and can be an absolute entity readily understood by the user. Such a reference common to different apparatus enables a reduction in man-hours for adjusting the respective apparatus.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 9 is a view showing specific gravities measured at measurement temperatures (measured specific gravities)

DESCRIPTION OF THE PREFERRED EMBODIMENTS

Preferred embodiments of this invention will be described in detail hereinafter with reference to the drawings.

Embodiment 1

Embodiment 1 of this invention will be described hereinafter with reference to the drawings.

Figure 1:
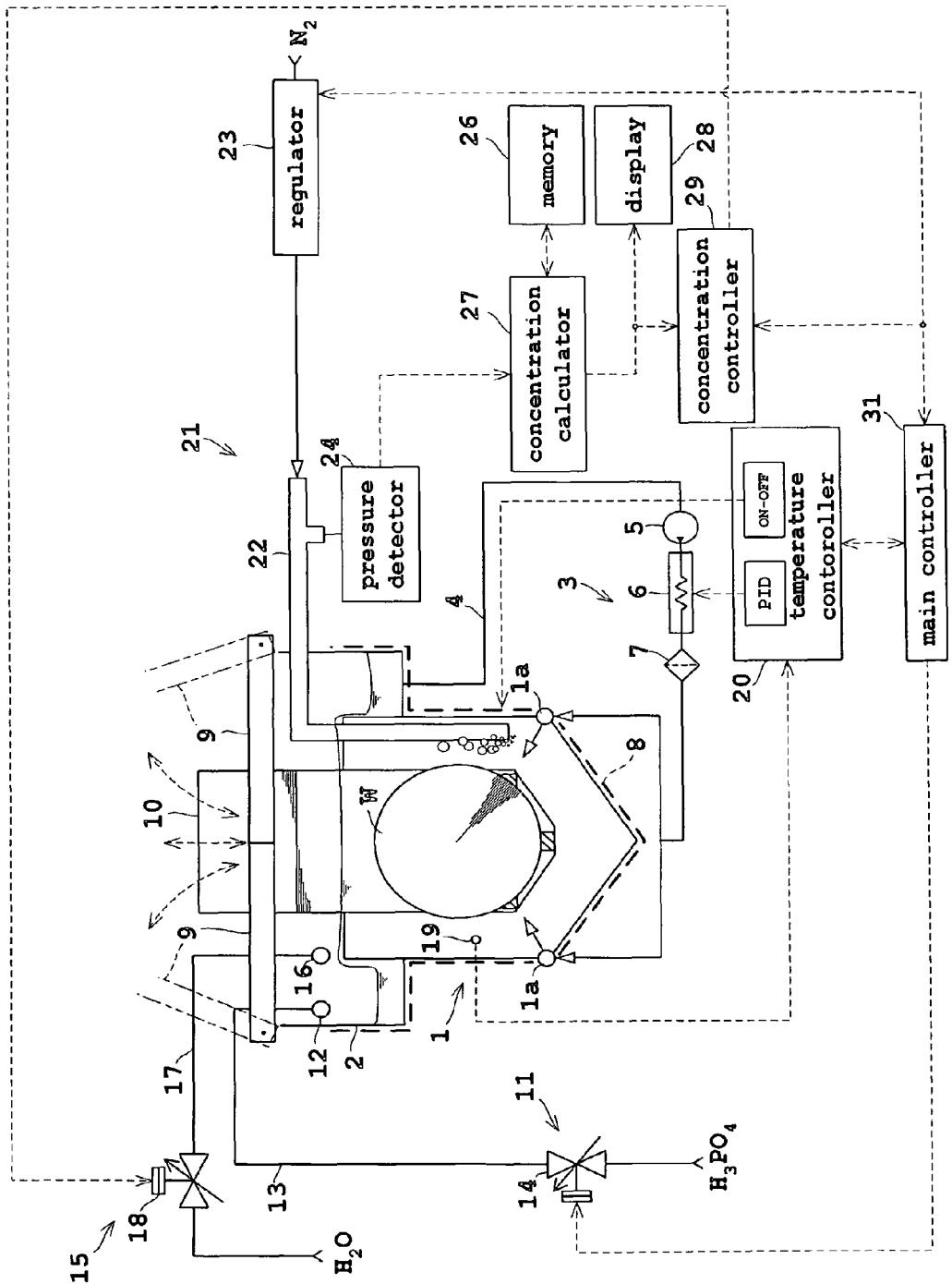
FIG. 1 is a block diagram showing an outline of a substrate treating apparatus in Embodiment 1.

FIG. 1 is a block diagram showing an outline of a substrate treating apparatus in Embodiment 1. This embodiment will be described by taking, for example, an apparatus for etching substrates (e.g. semiconductor wafers) as immersed in a heated treating solution which is a mixture of phosphoric acid ($H_3PO_4$) as a chemical and deionized water as a diluent.

The substrate treating apparatus has a treating tank 1 for storing the treating solution. A collecting tank 2 disposed around the treating tank 1 for collecting the treating solution overflowing the treating tank 1. The treating solution collected in the collecting tank 2 is returned to the treating tank 1 through a circulating system 3. The circulating system 3 includes piping 4 connecting the collecting tank 2 to jet pipes 1a disposed at the bottom of the treating tank 1. The piping 4 has a solution transmitting pump 5, an in-line heater 6 and a filter 7 arranged thereon. The in-line heater 6 is provided for heating, in the circulating system 3, the treating solution returned to the treating tank 1. The filter 7 is provided for removing particles from the treating solution returned to the treating tank 1. A tank heater 8 is disposed peripherally of the treating tank 1 and collecting tank 2 for heating the treating solution in each tank. The in-line heater 6 and tank heater 8 correspond to the heating device in this invention.

An openable cover 9 is disposed above the treating tank 1. A plurality of wafers W are held by a vertically movable holding arm 10 as arranged in vertical posture and equidistantly thereon. The cover 9 is closed when the holding arm 10 is outside the treating tank 1. The cover 9 is opened for allowing the holding arm 10 to load the group of wafers W into the treating tank 1. While the group of wafers W undergoes etching treatment in the tank 1, the cover 9 remains closed again.

A phosphoric acid supply device 11 is provided for supplying phosphoric acid to the collecting tank 2. The phosphoric acid supply device 11 includes a nozzle 12 disposed above the collecting tank 2, piping 13 for connecting the nozzle 12 to a phosphoric acid source, and a flow regulating valve 14 mounted on the piping 13. A deionized water supply device 15 is provided for supplementing deionized water to the treating tank 1. The deionized water supply device 15 includes a nozzle 16 disposed adjacent an edge of the treating tank 1, piping 17 for connecting the nozzle 16 to a deionized water source, and a flow regulating valve 18 mounted on the piping 17.

The treating tank 1 includes a temperature sensor 19 for detecting the temperature of the treating solution stored therein. A detection signal of the temperature sensor 19 is applied to a temperature controller 20. Based on this detection signal, the temperature controller 20 carries out a PID (proportional, integral and differential) control of the in-line heater 6 and an ON/OFF control of the tank heater 8.

Further, a concentration detecting device 21 is provided for the treating tank 1 for detecting the concentration of the treating solution therein. Noting the fact that a correlation exists between the concentration of phosphoric acid in the treating solution and the specific gravity of the treating solution, the concentration detecting device 21 is arranged to detect the concentration of the treating solution by substantially detecting the specific gravity of the treating solution containing phosphoric acid. Since the specific gravity of the treating solution containing phosphoric acid has a correlation with a pressure at a predetermined depth in the treating tank 1, the concentration detecting device 21 has a detecting end at the predetermined depth in the treating tank 1, and detects the concentration of the treating solution by detecting a pressure of the treating solution applied to the detecting end. A specific construction of the concentration detecting device 21 will be described hereinafter.

The concentration detecting device 21 includes a supply pipe 22, a regulator 23, a pressure detector 24, a memory 26, a concentration calculator 27, a display unit 28 and a concentration controller 29. The supply pipe 22 is formed of a fluororesin resistant to the treating solution, and has a lower end thereof acting as the detecting end located at the predetermined depth in the treating tank 1. The regulator 23 supplies nitrogen gas from a nitrogen gas source at a constant flow rate into the supply pipe 22. In a normal state, a nitrogen gas discharge pressure may be considered nearly equal to the liquid pressure at the predetermined depth from the liquid surface in the treating tank 1. The pressure detector 24 has a pressure sensor for measuring a nitrogen gas pressure in the supply pipe 22. The pressure detector 24 outputs a voltage of 0 to 2.5 [V], for example. This voltage may be regarded as the liquid pressure at the predetermined depth from the liquid surface in the treating tank 1. The concentration calculator 27 stores, in advance, a voltage corresponding to a pressure from the pressure detector 24 as a reference voltage $V_{DIW}$ (to be described hereinafter) in the memory 26. In time of treatment, the concentration calculator 27 derives an actual specific gravity of the treating solution from the reference voltage $V_{DIW}$ and a treatment voltage $V_{SOL}$, and determines a concentration of phosphoric acid in the treating solution in the treating tank 1 by referring to working curve data stored in the memory 26 and showing a correspondence between actual specific gravity and concentration. The actual specific gravity and concentration are successively displayed on the display unit 28.

The pressure detector 24 corresponds to the pressure detecting device and converting device in this invention. The memory 26 corresponds to the storage device in this invention. The concentration calculator 27 corresponds to the computing device in this invention.

A specific concentration calculating method is described in detail in Japanese Unexamined Patent Publication No. 11-219931 (1999), which, briefly, is as follows.

The detection signal (voltage) from the pressure detector 24 and the liquid pressure have a fixed functional relationship therebetween. The liquid pressure may be expressed as a sum of atmospheric pressure and a value proportional to the product of a distance (depth) from the liquid surface to the detecting end of the supply pipe 22 and the specific gravity of the treating solution. Therefore, the liquid pressure acting on the detecting end may be expressed by a function having variables consisting in the concentration of phosphoric acid in the solution and the depth of the detecting end. Thus, the concentration and depth are in a fixed relationship with the voltage outputted from the pressure detector 24. Based on this relationship, a concentration of phosphoric acid in the treating solution may be derived from the voltage outputted from the pressure detector 24 by determining beforehand a relationship between concentration and voltage for the predetermined depth.

Concentration data of phosphoric acid in the treating solution provided by the concentration detecting device 21 is applied from the concentration calculator 27 to the concentration controller 29. The concentration controller 29 controls the deionized water flow regulating valve 18 to adjust the amount of deionized water supplemented, so that a detected concentration of phosphoric acid in the treating solution becomes slightly higher than a boiling-point concentration corresponding to a set temperature of the treating solution. Specifically, the concentration controller 29 controls the flow regulating valve 18 by PID (proportional, integral and differential) control, based on a detected concentration of phosphoric acid in the treating solution.

The concentration controller 29 corresponds to the concentration control device in this invention.

A main controller 31 is provided to perform an overall control of the substrate treating apparatus. Specifically, the main controller 31 gives a command of a set temperature of the treating solution to the temperature controller 20, a command of a target concentration of the treating solution to the concentration controller 29, a control command to the phosphoric acid flow regulating valve 14, and so on.

Figure 2:
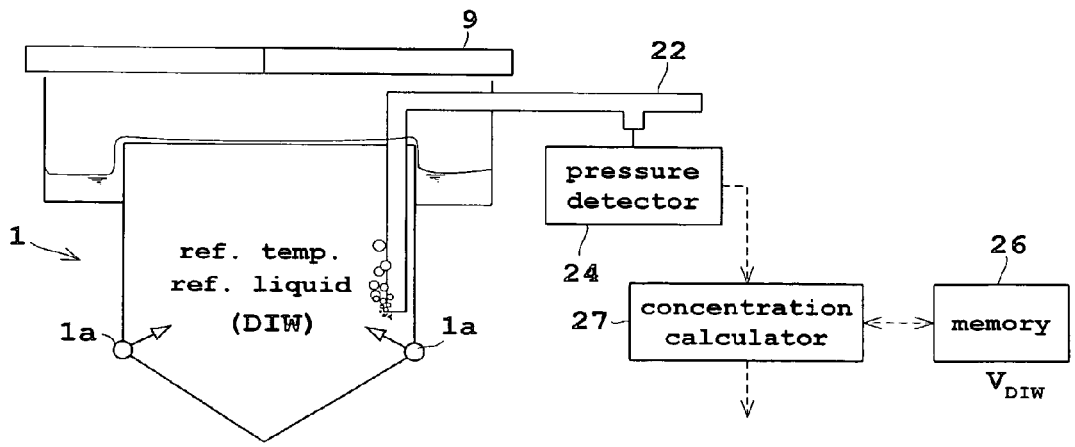
FIG. 2 is a view schematically showing measurement of a reference voltage.
Figure 3:
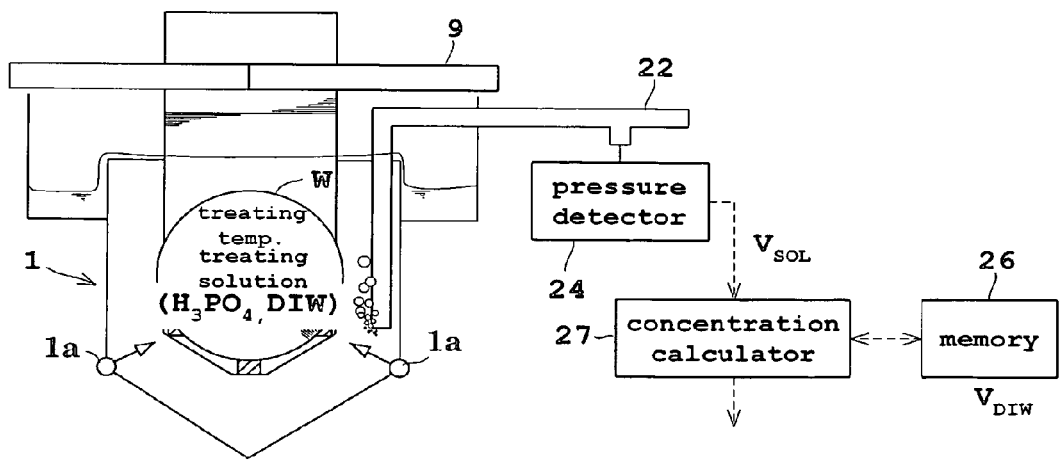
FIG. 3 is a view schematically showing measurement of a treatment voltage.
Figure 4:
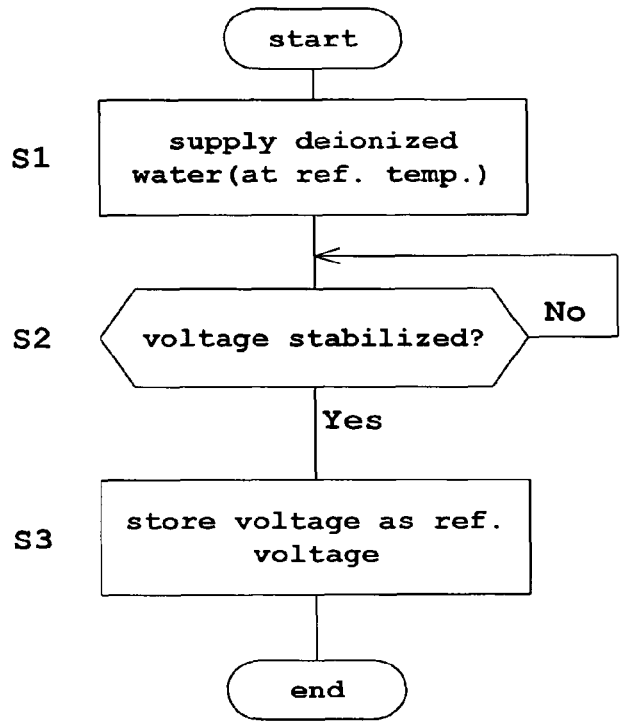
FIG. 4 is a flow chart showing a procedure of measuring the reference voltage.
Figure 5:
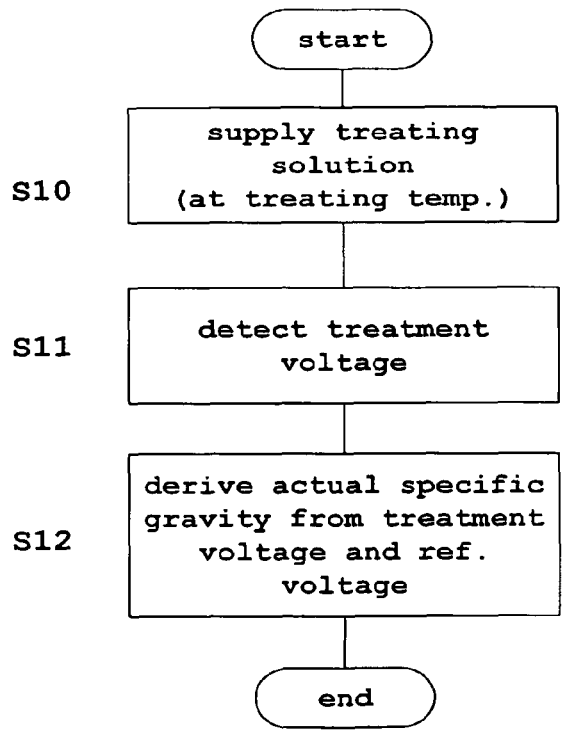
FIG. 5 is a flow chart showing a procedure of measuring the treatment voltage.

The "reference voltage" and "treatment voltage" noted hereinbefore will be described with reference to FIGS. 2 through 5. FIG. 2 is a view schematically showing measurement of the reference voltage. FIG. 3 is a view schematically showing measurement of the treatment voltage. FIG. 4 is a flow chart showing a procedure of measuring the reference voltage. FIG. 5 is a flow chart showing a procedure of measuring the treatment voltage.

"Measurement of Reference Voltage"

The reference voltage is measured in advance of actual treatment of wafers W, as follows.

First, as shown in FIG. 2, a reference liquid at a reference temperature is stored in the treating tank 1. The reference temperature is 25° C., and the reference liquid deionized water, for example. Then, the pump 5 is controlled to circulate the deionized water at the same flow rate as in time of treatment described hereinafter (step S1). Distilled water, for example, may be used as the reference liquid, instead. The reference temperature may be in a range of 25 to 30° C.

The concentration calculator 27 monitors for stabilization of the voltage which is an output signal from the pressure detector 24 (step S2). When stabilized, the voltage at that time is written and stored as reference voltage $V_{DIW}$ in the memory 26 (step S3).

Because of the construction of the treating tank 1, deionized water simply stored will spill little by little therefrom, thereby gradually lowering the water surface. The pressure at the detecting end of the supply pipe 22 is variable with the surface level. It is therefore desirable to circulate the deionized water through the circulating system 3. In this way, the surface level may be maintained constant to maintain the detecting end of the supply pipe 22 at a constant depth. Thus, the same condition is provided for detecting the pressures of the reference liquid and treating solution. By equalizing the conditions for detecting the two pressures, an actual specific gravity is measured with increased accuracy as described hereinafter.

"In Time of Treatment"

As shown in FIG. 3, the treating solution at a treating temperature is stored in the treating tank 1. The treating temperature is 160° C., for example, and the treating solution is a mixture of phosphoric acid and deionized water. Then, the pump 5 is controlled to circulate the treating solution at a circulation flow rate for treatment (step S10).

At this time, the voltage (treatment voltage $V_{SOL}$) from the pressure detector 24 is measured (step S11). An operation is carried out to divide treatment voltage $V_{SOL}$ by reference voltage $V_{DIW}$ stored in the memory 26 (step S12). The result ($=V_{SOL}/V_{DIW}$) indicates an actual specific gravity since the specific gravity of deionized water is 1 [g/cm$^3$]. The treating solution is adjusted based on this actual specific gravity and the working curve data of specific gravity and concentration, as described hereinafter.

The reference voltage $V_{DIW}$ determined for different apparatus or for different treating tanks 1 of the same apparatus may be used as references for the different apparatus or for different treating tanks 1. Assume that reference voltage $V_{DIW}$=0.845[V] for tank A, and reference voltage $V_{DIW}$=0.830[V] for tank B. Assume also that the specific gravity corresponding to the concentration of the treating solution in time of treatment is 1.55 [g/cm$^3$]. In such a case, voltages serving as the targets of adjustment in time of treatment in tank A and tank B are as follows:
Tank A: 1.55×0.845=1.309[V]
Tank B: 1.55×0.830=1.286[V]

Figure 6:
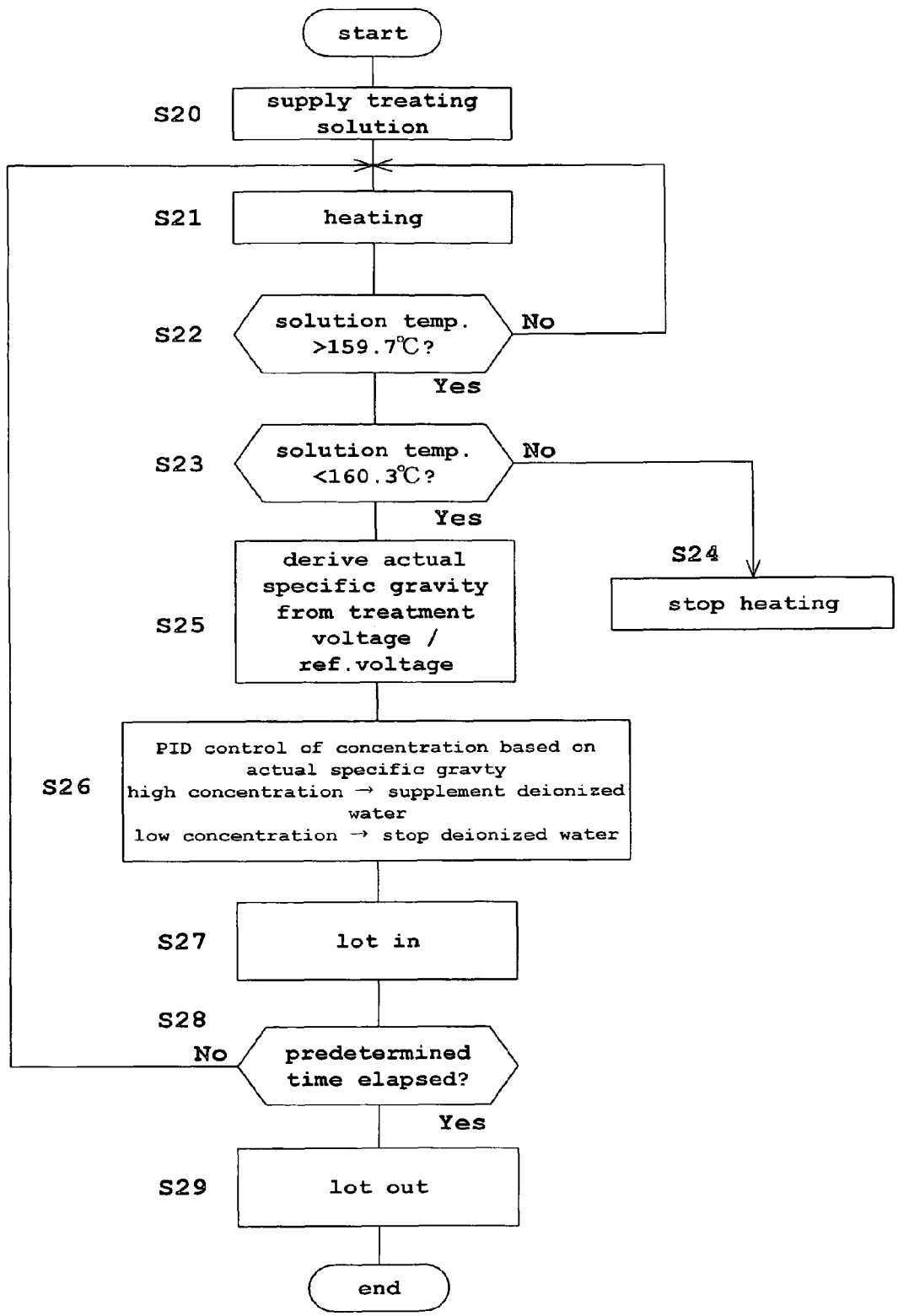
FIG. 6 is a flow chart showing a procedure of treatment.

Next, operation in time of actual treatment will be described with reference to FIG. 6. FIG. 6 is a flow chart showing a procedure of treatment Steps S20 and S21

First, the phosphoric acid flow regulating valve 14 is opened to supply phosphoric acid to the collecting tank 2. The phosphoric acid supplied to the collecting tank 2 is heated by the in-line heater 6 while being transmitted to the treating tank 1 through the circulating system 3. The phosphoric acid introduced into the treating tank 1 is heated also by the tank heater 8.

Steps S22, S23 and S24

The temperature of the phosphoric acid in the treating tank 1 is detected by the temperature sensor 19, and a corresponding signal is applied to the temperature controller 20. The temperature controller 20 controls the temperature of the phosphoric acid to be within ±0.3° C. of a predetermined temperature of 160° C. Specifically, when the solution temperature is below 159.7° C., the heating by the in-line heater 6 and tank heater 8 is continued. When the solution temperature exceeds 160.3° C., the heating by the in-line heater 6 and tank heater 8 is stopped to allow the solution temperature to lower by natural cooling. When the solution temperature is brought within the range of 159.7 to 160.3° C., the operation proceeds to step S25.

Step S25

The treatment voltage $V_{SOL}$ is obtained from the pressure detector 24. The concentration calculator 27 determines a ratio between the treatment voltage $V_{SOL}$ and the reference voltage $V_{DIW}$ stored in the memory 26, and calculates a concentration from this ratio and the working curve data.

Step S26

The concentration of the solution in the treating tank 1 is detected from time to time by the concentration detecting device 21 as in step S25 described above. The concentration controller 29 controls the flow regulating valve 18 by PID control to supplement the treating tank 1 with deionized water so that the detected concentration agrees with a target concentration set beforehand. This target concentration, preferably, is set to be slightly higher than the boiling-point concentration corresponding to the set temperature of the treating solution. When the detected concentration of the treating solution in the treating tank 1 exceeds a target concentration range, the supplying of deionized water is continued. When the detected concentration is less than the target concentration range, the supplying of deionized water is stopped. When the supplying of deionized water is stopped, the deionized water in the treating solution evaporates by the heating of the treating solution, whereby the concentration of the treating solution increases automatically.

Steps S27, S28 and S29

When the treating solution in the treating tank 1 is brought into and stabilizes in the target concentration range, the group of wafers W held by the holding arm 10 is loaded into the treating tank 1, and etching treatment of the wafers W is started. The temperature control and concentration control in steps S21-S26 are repeated until a predetermined treating time elapses. After the treating time, the group of wafers W is withdrawn upward from inside the treating tank 1 and transferred to a next treating tank.

As described above, deionized water at the reference temperature is stored in the treating tank 1 in advance of actual treatment of a group of wafers W. In this state, the pressure detector 24 converts the pressure into a voltage, which is stored in the memory 26 as reference voltage $V_{DIW}$. Next, the treating solution stored in the treating tank 1 is heated to the treating temperature. A voltage corresponding to the pressure detected in the state is regarded as treatment voltage $V_{SOL}$. The concentration calculator 27 derives an actual specific gravity of the treating solution from the treatment voltage $V_{SOL}$ and the reference voltage $V_{DIW}$ stored beforehand. The actual specific gravity expresses a ratio to the reference voltage $V_{DIW}$ of this apparatus, and has an absolute meaning. A reference voltage $V_{DIW}$ detected from among different apparatus can be used for comparison between the apparatus, and can represent an absolute value readily understood by the user. Such a reference common to different apparatus enables a reduction in man-hours for adjusting the respective apparatus.

Embodiment 2

Embodiment 2 of this invention will be described hereinafter with reference to the drawings.

Reference is made to FIG. 1 since the apparatus has a similar construction to what is shown in Embodiment 1.

The substrate treating apparatus has a treating tank 1 for storing the treating solution. A collecting tank 2 disposed around the treating tank 1 for collecting the treating solution overflowing the treating tank 1. The treating solution collected in the collecting tank 2 is returned to the treating tank 1 through a circulating system 3. The circulating system 3 includes piping 4 connecting the collecting tank 2 to jet pipes 1a disposed at the bottom of the treating tank 1. The piping 4 has a solution transmitting pump 5, an in-line heater 6 and a filter 7 arranged thereon. The in-line heater 6 is provided for heating, in the circulating system 3, the treating solution returned to the treating tank 1. The filter 7 is provided for removing particles from the treating solution returned to the treating tank 1. A tank heater 8 is disposed peripherally of the treating tank 1 and collecting tank 2 for heating the treating solution in each tank. The in-line heater 6 and tank heater 8 correspond to the heating device in this invention.

An openable cover 9 is disposed above the treating tank 1. A plurality of wafers W are held by a vertically movable holding arm 10 as arranged in vertical posture and equidistantly thereon. The cover 9 is closed when the holding arm 10 is outside the treating tank 1. The cover 9 is opened for allowing the holding arm 10 to load the group of wafers W into the treating tank 1. While the group of wafers W undergoes etching treatment in the tank 1, the cover 9 remains closed again.

A phosphoric acid supply device 11 is provided for supplying phosphoric acid to the collecting tank 2. The phosphoric acid supply device 11 includes a nozzle 12 disposed above the collecting tank 2, piping 13 for connecting the nozzle 12 to a phosphoric acid source, and a flow regulating valve 14 mounted on the piping 13. A deionized water supply device 15 is provided for supplementing deionized water to the treating tank 1. The deionized water supply device 15 includes a nozzle 16 disposed adjacent an edge of the treating tank 1, piping 17 for connecting the nozzle 16 to a deionized water source, and a flow regulating valve 18 mounted on the piping 17.

The treating tank 1 includes a temperature sensor 19 for detecting the temperature of the treating solution stored therein. A detection signal of the temperature sensor 19 is applied to a temperature controller 20. Based on this detection signal, the temperature controller 20 carries out a PID (proportional, integral and differential) control of the in-line heater 6 and an ON/OFF control of the tank heater 8.

Further, a concentration detecting device 21 is provided for the treating tank 1 for detecting the concentration of the treating solution therein. Noting the fact that a correlation exists between the concentration of phosphoric acid in the treating solution and the specific gravity of the treating solution, the concentration detecting device 21 is arranged to detect the concentration of the treating solution by substantially detecting the specific gravity of the solution. Since the specific gravity of the treating solution containing phosphoric acid has a correlation with a pressure at a predetermined depth in the treating tank 1, the concentration detecting device 21 has a detecting end at the predetermined depth in the treating tank 1, and detects the concentration of the treating solution by detecting a pressure of the treating solution applied to this element. A specific construction of the concentration detecting device 21 will be described hereinafter.

The concentration detecting device 21 includes a supply pipe 22, a regulator 23, a pressure detector 24, a memory 26, a concentration calculator 27, a display unit 28 and a concentration controller 29. The supply pipe 22 is formed of a fluororesin resistant to the treating solution, and has a lower end thereof acting as the detecting end located at the predetermined depth in the treating tank 1. The regulator 23 supplies nitrogen gas from a nitrogen gas source at a constant flow rate into the supply pipe 22. In a normal state, a nitrogen gas discharge pressure may be considered nearly equal to the liquid pressure at the predetermined depth from the liquid surface in the treating tank 1. The pressure detector 24 has a pressure sensor for measuring a nitrogen gas pressure in the supply pipe 22. The pressure detector 24 outputs a voltage of 0 to 2.5 [V], for example. This voltage may be regarded as the liquid pressure at the predetermined depth from the liquid surface in the treating tank 1.

The pressure detector 24 corresponds to the pressure detecting device in this invention.

The concentration calculator 27 stores, in advance, a voltage corresponding to a pressure from the pressure detector 24 as a reference voltage $V_{DIW}$ (to be described hereinafter) in the memory 26. In time of treatment, the concentration calculator 27 derives an actual specific gravity of the treating solution from the reference voltage $V_{DIW}$ and a treatment voltage $V_{SOL}$. Further, the concentration calculator 27 determines a reduced actual specific gravity by multiplying this actual specific gravity by a "factor". Then, the concentration calculator 27 determines a concentration (reduced concentration) of phosphoric acid in the treating solution in the treating tank 1 from the reduced actual specific gravity by referring to working curve data stored in the memory 26 and showing specific gravity-concentration characteristics, based on the reduced actual specific gravity. Under control of the concentration calculator 27, the display unit 28 successively displays the actual specific gravity, reduced actual specific gravity, reduced concentration, and so on. As described in detail hereinafter, the reduced actual specific gravity is a reduced value of actual specific gravity obtained from a temperature of the treating solution in time of measuring the specific gravity-concentration characteristics. The reduced concentration is a reduced concentration value of treating temperature at a measurement temperature in time of collecting the specific gravity-concentration characteristics. The working curve data showing the specific gravity-concentration characteristics may be replaced with a numerical formula expressing the characteristics.

The memory 26 corresponds to the storage device in this invention. The concentration calculator 27 corresponds to the specific gravity calculating device, reducing device and computing device in this invention.

As noted in Embodiment 1, a specific concentration calculating method is described in detail in Japanese Unexamined Patent Publication No. 11-219931 (1999).

Concentration data (i.e. reduced concentration to be described hereinafter) of the treating solution provided by the concentration detecting device 21 is applied from the concentration calculator 27 to the concentration controller 29. The concentration controller 29 controls the deionized water flow regulating valve 18 to adjust the amount of deionized water supplied, so that a detected concentration of phosphoric acid in the treating solution becomes slightly higher than a boiling-point concentration corresponding to a set temperature of the treating solution. Specifically, the concentration controller 29 controls the flow regulating valve 18 by PID (proportional, integral and differential) control, based on a detected concentration of phosphoric acid in the treating solution.

A main controller 31 is provided to perform an overall control of the substrate treating apparatus. Specifically, the main controller 31 gives a command of a set temperature of the treating solution to the temperature controller 20, a command of a target concentration of the treating solution to the concentration controller 29, a control command to the phosphoric acid flow regulating valve 14, and so on.

Figure 7:
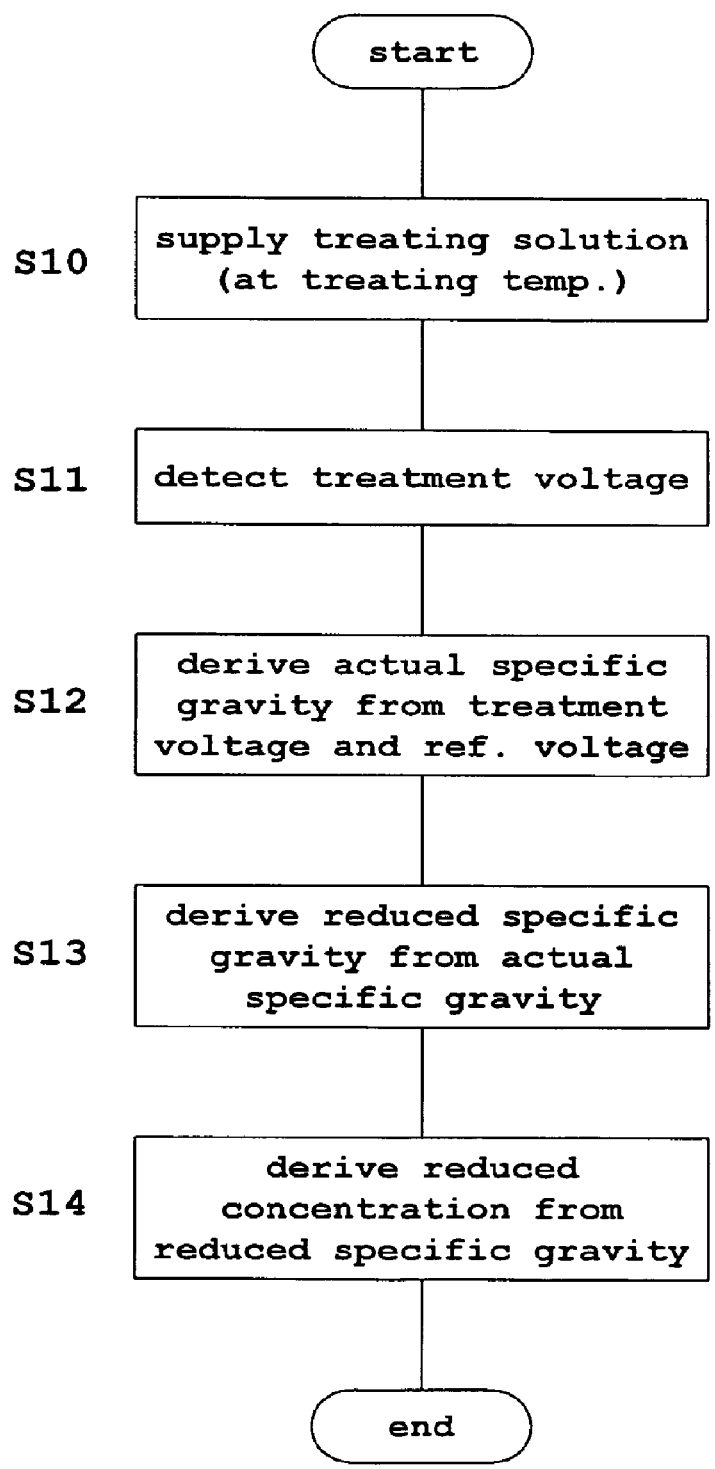
FIG. 7 is a flow chart showing measurement of a treatment voltage in Embodiment 2.
Figure 8:
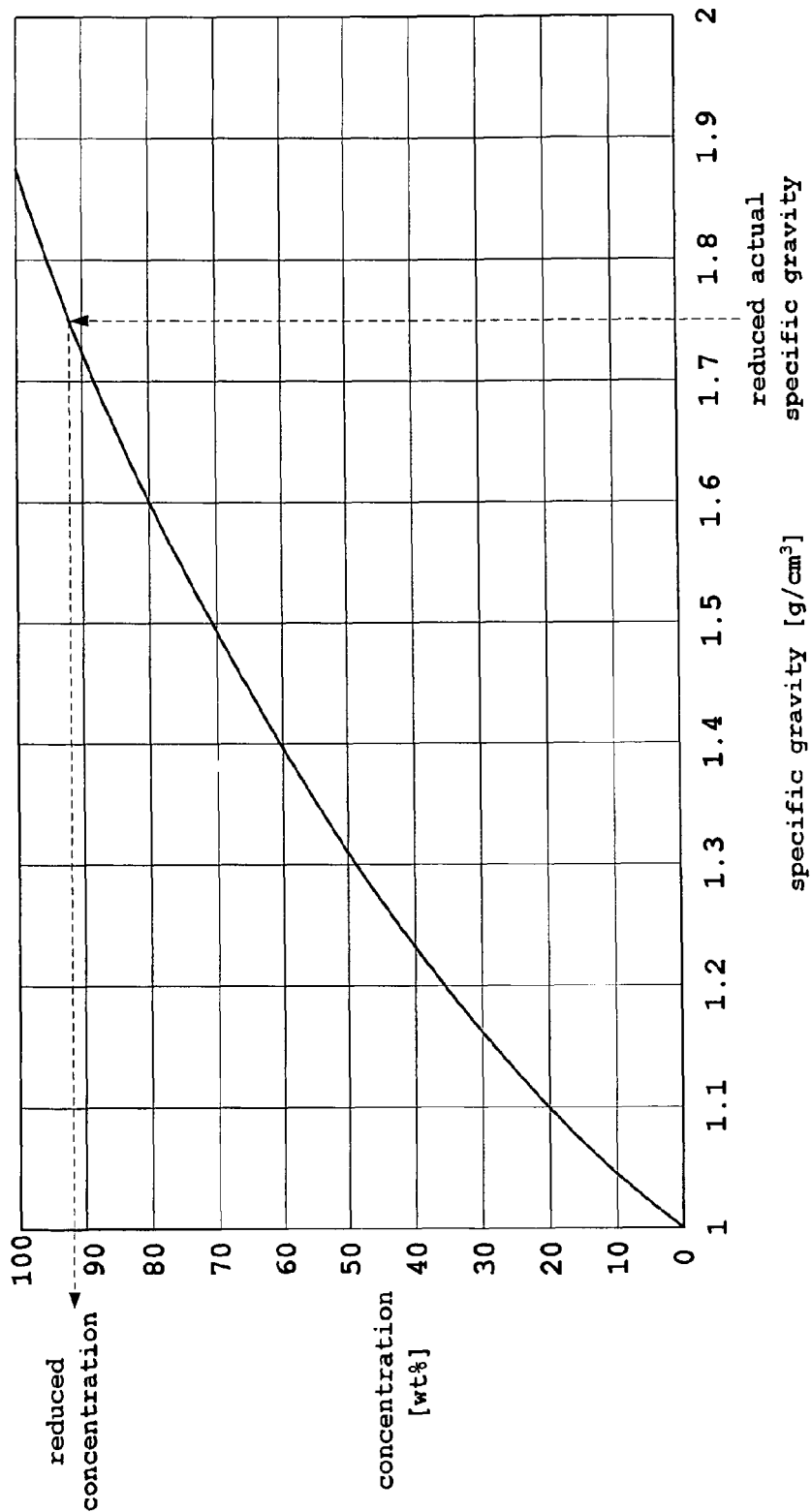
FIG. 8 is a view schematically showing a procedure of obtaining a reduced concentration.

The "reference voltage" and "treatment voltage" are similar to those described in Embodiment 1. These voltages in this embodiment will be described with reference to FIGS. 7 through 9. FIG. 7 is a flow chart showing a measuring procedure in time of treatment. FIG. 8 is a view schematically showing a procedure of obtaining a converted concentration. FIG. 9 is a view showing specific gravities (measured specific gravities) measured at measurement temperatures.

"In Time of Treatment"

As shown in FIG. 3 referred to in Embodiment 1, the treating solution at a treating temperature is stored in the treating tank 1. The treating temperature is 160° C., for example, and the treating solution is a mixture of phosphoric acid and deionized water. Then, the pump 5 is controlled to circulate the treating solution at a circulation flow rate for treatment (step S10).

At this time, the voltage (treatment voltage $V_{SOL}$) from the pressure detector 24 is measured (step S11). An operation is carried out to divide treatment voltage $V_{SOL}$ by reference voltage $V_{DIW}$ stored in the memory 26 (step S12). The result ($=V_{SOL}/V_{DIW}$) indicates an actual specific gravity since the specific gravity of deionized water is 1 [g/cm$^3$].

The reference voltage $V_{DIW}$ determined for different apparatus or for different treating tanks 1 of the same apparatus may be used as references for the different apparatus or for different treating tanks 1. Assume that reference voltage $V_{DIW}$=0.845[V] for tank A, and reference voltage $V_{DIW}$=0.830[V] for tank B. Assume also that the specific gravity corresponding to the concentration of the treating solution in time of treatment is 1.55 [g/cm$^3$]. In such a case, voltages serving as the targets of adjustment in time of treatment in tank A and tank B are as follows:

Tank A: 1.55×0.845=1.309[V]

Tank B: 1.55×0.830=1.286[V]

The actual specific gravity obtained as described above corresponds to the specific gravity of the treating solution at the treating temperature. Generally, data of the specific gravity-concentration characteristics of the treating solution is collected only on condition of a predetermined measurement temperature (e.g. 25° C.). It is therefore impossible to derive an exact concentration from the actual specific gravity at the treating temperature and the specific gravity-concentration characteristics.

Inventor measured treatment voltage $V_{SOL}$ at each temperature of 150° C., 155° C. and 160° C. of the treating solution. The treating solution at each temperature was placed in a sealed container, and cooled to the measurement temperature (e.g. 25° C.). Its specific gravity at the measurement temperature (measured specific gravity) was measured with a specific gravity meter of unit construction. Then, it has been found that, as shown in FIG. 9, a common ratio (k) of 1.084 exists between actual specific gravity (m1) and measured specific gravity (m2) at each temperature. This ratio (k) results from thermal expansion. Thus, the ratio (k) is substantially valid at 140 to 170° C. covering the above temperature range.

For the above temperature range, the treating solution at the treating temperature is reduced to a specific gravity at the measurement temperature to determine a reduced actual specific gravity by multiplying by the ratio k=1.084 the actual specific gravity (m1) obtained in step S12 as described above (step S13). After obtaining the reduced actual specific gravity, as shown in the graph of FIG. 8, a reduced concentration is derived from the specific gravity-concentration characteristics collected at the measurement temperature (25° C.) (step S14). The concentration calculator 27 derives a reduced concentration through steps S10-S14 described above, and outputs it to the display unit 28 and concentration controller 29.

Figure 10:
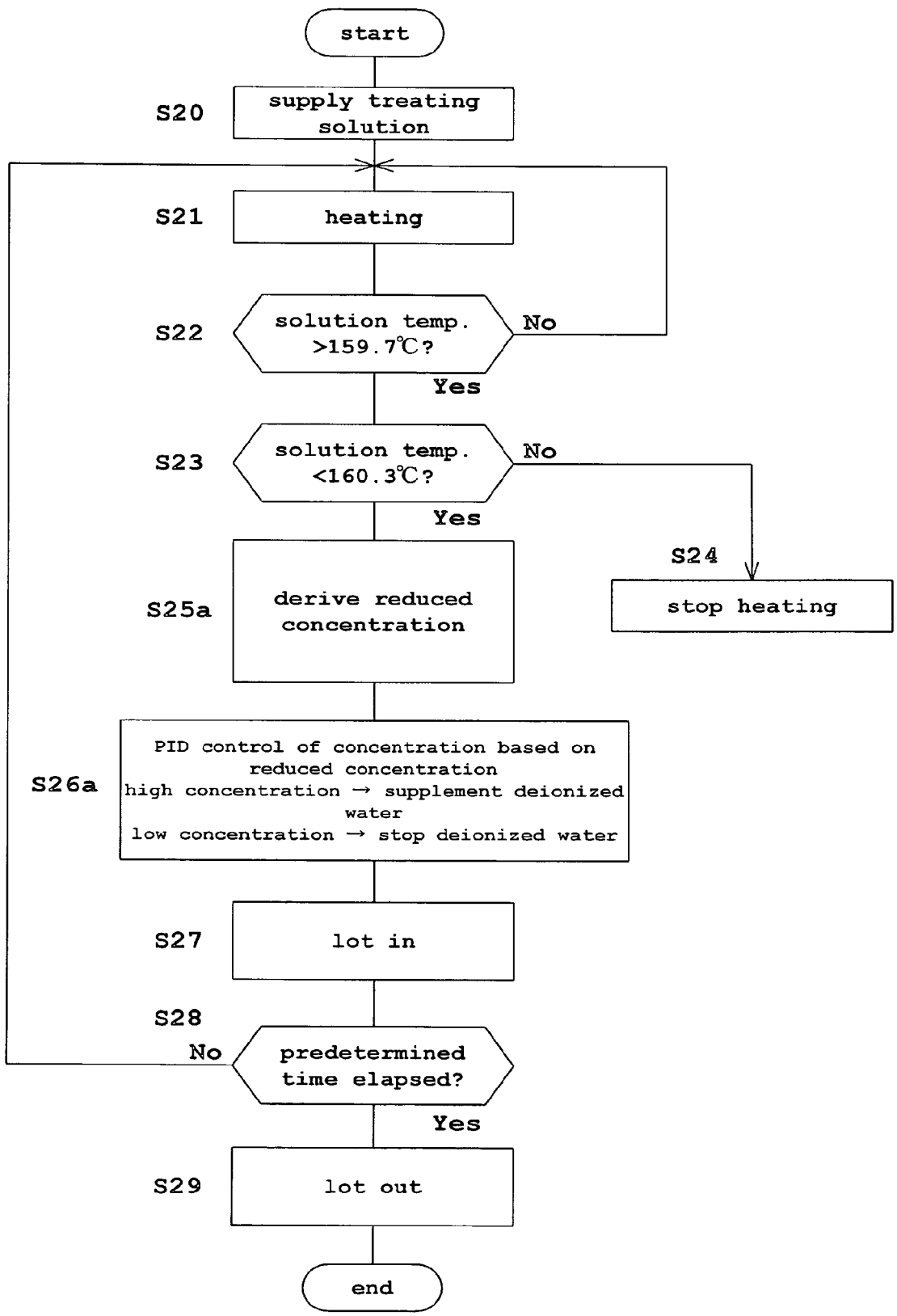
FIG. 10 is a flow chart showing a procedure of treatment.

Next, operation in time of actual treatment will be described with reference to FIG. 10. FIG. 10 is a flow chart showing a procedure of treatment Steps S20 and S21

First, the phosphoric acid flow regulating valve 14 is opened to supply phosphoric acid to the collecting tank 2. The phosphoric acid supplied to the collecting tank 2 is heated by the in-line heater 6 while being transmitted to the treating tank 1 through the circulating system 3. The phosphoric acid introduced into the treating tank 1 is heated also by the tank heater 8.

Steps S22, S23 and S24

The temperature of the phosphoric acid in the treating tank 1 is detected by the temperature sensor 19, and a corresponding signal is applied to the temperature controller 20. The temperature controller 20 controls the temperature of the phosphoric acid to be within ±0.3° C. of a predetermined temperature of 160° C. Specifically, when the solution temperature is below 159.7° C., the heating by the in-line heater 6 and tank heater 8 is continued. When the solution temperature exceeds 160.3° C., the heating by the in-line heater 6 and tank heater 8 is stopped to allow the solution temperature to lower by natural cooling. When the solution temperature is brought within the range of 159.7 to 160.3° C., the operation proceeds to step S25.

Step S25a

The concentration detecting device 21 calculates the reduced concentration of the treating solution in the treating tank 1 as described in steps S10 through S14 described above.

Step S26a

The reduced concentration is detected from time to time by the concentration detecting device 21 as in step S25a described above. The concentration controller 29 controls the flow regulating valve 18 by PID control to supplement the treating tank 1 with deionized water so that the reduced concentration agrees with a target concentration set beforehand. This target concentration, preferably, is set to be slightly higher than the boiling-point concentration corresponding to the set temperature of the treating solution. When the detected concentration of the treating solution in the treating tank 1 exceeds a target concentration range, the supplying of deionized water is continued. When the detected concentration is less than the target concentration range, the supplying of deionized water is stopped. When the supplying of deionized water is stopped, the deionized water in the treating solution evaporates by the heating of the treating solution, whereby the concentration of the treating solution increases automatically.

Steps S27, S28 and S29

When the treating solution in the treating tank 1 is brought into and stabilizes in the target concentration range, the group of wafers W held by the holding arm 10 is loaded into the treating tank 1, and etching treatment of the wafers W is started. The temperature control and concentration control in steps S21-S26a are repeated until a predetermined treating time elapses. After the treating time, the group of wafers W is withdrawn upward from inside the treating tank 1 and transferred to a next treating tank.

As described above, the reference liquid at the reference temperature is stored in the treating tank 1 in advance of treatment. In this state, the voltage outputted from the pressure detector 24 is stored in the memory 26 as reference voltage $V_{DIW}$. Next, the treating solution stored in the treating tank 1 is heated to the treating temperature. A voltage obtained in the state is regarded as treatment voltage $V_{SOL}$. The concentration calculator 27 derives an actual specific gravity (m1) of the treating solution from the treatment voltage $V_{SOL}$ and reference voltage $V_{DIW}$. The actual specific gravity (m1) expresses a ratio to the reference voltage $V_{DIW}$ of this apparatus, and has an absolute meaning. A reference voltage measured of different apparatus can be used for comparison between the apparatus. The concentration calculator 27 reduces the actual specific gravity (m1) to a specific gravity at the measurement temperature to determine a reduced actual specific gravity. The reduced actual specific gravity is a reduced value of the actual specific gravity obtained from the temperature of the treating solution in time of measuring the specific gravity-concentration characteristics. The concentration calculator 27 determines a reduced concentration, assuming that the treating solution has cooled to the measurement temperature, based on the reduced actual specific gravity and specific gravity-concentration characteristics. Thus, the actual specific gravity (m1) expresses a ratio to the reference voltage $V_{DIW}$ of the apparatus. The reduced concentration obtained by temperature reduction based on the actual specific gravity also has an absolute value. A reduced concentration determined for different apparatus can be used for comparison between the apparatus, and can be an absolute entity readily understood by the user. Such a reference common to different apparatus enables a reduction in man-hours for adjusting the respective apparatus.

This invention is not limited to the foregoing embodiments, but may be modified as follows:

(1) Embodiments 1 and 2 have been described by taking a treating solution containing phosphoric acid for example. This invention is applicable also to other treating solutions such as a sulfuric acid solution.

(2) In Embodiments 1 and 2 described above, the detected phosphoric acid concentration in the treating solution is controlled to be slightly higher than a boiling point concentration corresponding to a preset temperature of the treating solution. This invention is not limited to such control.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating method for treating substrates with a treating solution having a mixture of a chemical and a diluent, comprising:
    a step of deriving an actual specific gravity of the treating solution from a reference voltage obtained by a pressure detecting device according to a pressure at a predetermined depth in a treating tank when a reference liquid at a reference temperature is stored in the treating tank in advance of treatment, and a treatment voltage obtained by the pressure detecting device when the treating solution stored in the treating tank has been set to a treating temperature;
    a step of determining a reduced actual specific gravity by reducing said actual specific gravity to a specific gravity in time of a measuring temperature when measuring a specific gravity-concentration characteristics of the treating solution;
    a step of deriving a reduced concentration of the treating solution from said reduced actual specific gravity and said specific gravity-concentration characteristics; and
    a step of adjusting the treating solution based on said reduced concentration.

2. A method as defined in claim 1, wherein said treating temperature is in a range of 140 to 170° C.

3. A method as defined in claim 1, wherein said treating solution has phosphoric acid diluted with deionized water, and said reference liquid is deionized water.

4. A method as defined in claim 1, wherein the step of determining said reduced actual specific gravity is executed to determine said reduced actual specific gravity at the treating temperature by multiplying the actual specific gravity obtained by said actual specific gravity calculating device, by a factor set beforehand according to a ratio between the actual specific gravity of the treating solution at the treating temperature and a measured specific gravity obtained by a specific gravity meter from said treating solution at a measurement temperature.

5. A method as defined in claim 4, wherein said treating temperature is in a range of 140 to 170° C.

* * * * *